United States Patent [19]

de Sa e Silva et al.

[11] Patent Number: 5,206,540
[45] Date of Patent: Apr. 27, 1993

[54] TRANSFORMER ISOLATED DRIVE CIRCUIT

[75] Inventors: Claudio de Sa e Silva, Lynnwood, Wash.; Jeffrey D. Putsch, Milford, N.H.; Varnum S. Holland, Amherst, N.H.; Wilburn M. Miller, Wilton, N.H.

[73] Assignee: Unitrode Corporation, Billerica, Mass.

[21] Appl. No.: 697,895

[22] Filed: May 9, 1991

[51] Int. Cl.[5] .................. H03K 5/135; H03K 17/284; G05F 1/56
[52] U.S. Cl. .................. 307/127; 307/571; 307/592; 323/290; 361/245; 361/82; 361/153
[58] Field of Search .................. 323/290, 285; 361/90, 361/92, 245, 246, 79, 78, 82–84, 86, 87, 154, 153, 187; 307/127, 130, 131, 571, 580, 592, 593, 265, 296.6

[56] References Cited

U.S. PATENT DOCUMENTS

| | | | |
|---|---|---|---|
| 3,675,051 | 7/1972 | Mioduski | 307/592 |
| 4,052,623 | 10/1977 | Loberg | 307/571 |
| 4,438,356 | 3/1984 | Fleischer | 307/571 |
| 4,461,966 | 7/1984 | Hebenstreit | 307/571 |
| 4,634,903 | 1/1987 | Montorfano | 307/571 |
| 4,792,746 | 12/1988 | Josephson et al. | 323/290 |
| 4,876,624 | 10/1989 | Chow | 361/87 |

OTHER PUBLICATIONS

"Gate Drive Requirements," Section 1–Chapter 6, Motorola Power MOSFET Transistor Databook, 1988, pp. 1-6-2-1-6-22.

Wood, P., "Transformer-Isolated HEXFET Driver Provides very large duty cycle ratios," International Rectifier, Chapter 15, Application Note 950A, pp. A-141-A-143.

Primary Examiner—A. D. Pellinen
Assistant Examiner—Richard T. Elms
Attorney, Agent, or Firm—Weingarten, Schurgin, Gagnebin & Hayes

[57] ABSTRACT

A transformer isolated circuit for driving a semiconductor power switch includes a transformer which is driven with a high frequency Pulse Width Modulated (PWM) signal in such a way that the constantly present PWM carrier supplies the power needed for high gate current pulses, while different duty cycles determine the "on" or "off" state of the power device under control. Transformer saturation is prevented by sensing primary current and returning it to zero once per PWM cycle. Because of the high PWM carrier frequency used, the average transformer power is low, yet the secondary side is able to deliver high pulse currents for fast "on-off" switching of the gate of even the largest N- or P-channel device, without need for auxiliary power supplies. Also included are provisions for extremely fast output current limiting, for use where short circuit protection is necessary. Discussion of a monolithic implementation is included.

13 Claims, 3 Drawing Sheets

TRANSFORMER ISOLATED DRIVE CIRCUIT

FIELD OF THE INVENTION

This invention relates to drive circuits and more particularly, to a transformer isolated drive circuit.

BACKGROUND OF THE INVENTION

Many low voltage electronic circuits have a need to drive high voltage switching transistors through an isolating barrier. This need stems from the fact that a voltage differential of at least 100 volts typically exists between the low voltage control logic and the high voltage power switch. Therefore, for safety and other reasons, the control logic and high voltage switch must be electrically isolated.

Several circuits addressing these problems have been previously proposed. For example, circuits utilizing a number of low voltage power supplies coupled to the power switches, high-speed opto-couplers, or other extensive electrical isolation circuits have been proposed, although all have met with limited success due to problems associated with their excessive size and cost, low reliability due to the large number of components, or the inability of the circuit to control a power device over the full duty cycle range of 0 to 100%.

Transformer coupling of low voltage control signals to the high voltage power switches provides several advantages such as electrical isolation and step up or step down capabilities. Unfortunately however, transformers are generally only capable of coupling higher frequency AC signals since the transformer quickly becomes saturated by any DC signal components. For this reason, many prior art transformer isolated semiconductor drive circuits have been limited to 50% duty cycle with roughly equal positive and negative volt-seconds to avoid transformer saturation.

Prior art transformer isolated semiconductor drive circuits utilizing a modulated drive signal are generally still limited to a duty cycle ratio of between 1 and 99%, to prevent transformer saturation. Oftentimes, however, a duty cycle of 0% or 100% is required and cannot be provided by known circuits.

SUMMARY OF THE INVENTION

This invention features a high reliability, transformer isolated, high-voltage drive circuit capable of operating over a full range of 0 to 100% duty cycle without transformer saturation. These, and other features are provided by the present invention which includes a retriggerable timer which provides a timed output signal and enables a voltage control circuit, for providing a voltage control signal which controls first and second voltage sources which produce first and second voltage signals of selectable voltage potentials. Different combinations of the selectable voltage potentials provide alternating positive and negative polarity relative to the primary winding of a transformer. The retriggerable timer is triggered by an input control signal at any time during the operation of the timer. The input control signal and the timed output signal from the retriggerable timer provide the voltage control signal necessary for enabling the first and second voltage sources to provide the various preselected, combinations of high, medium and low voltage signals.

The voltage level and voltage polarity on the first and second inputs of the transformer primary winding induce a voltage of corresponding polarity on first and second outputs of the transformer secondary winding. Voltage level sense means, coupled to the first and second outputs of the transformer's secondary winding, are responsive to the voltage and polarity induced on the first and second outputs of the secondary winding, for enabling a load switch in response to a first sensed voltage level and polarity, and for disabling the load switch in response to a second, sensed voltage level and polarity.

The first and second voltage sources include first and second current sense means, for sensing current flow in the primary winding of the transformer, and for providing first and second zero current indicator signals upon the detection of zero current flow in the transformer's primary winding. A trigger signal generator is responsive to the first and second zero current indicator signals, the voltage control signal, and the timed output signal from the retriggerable timer, for providing a retriggerable timer trigger signal upon the combination of the expiration of the timed output signal from the retriggerable timer and receipt of at least one of the first and second zero current indicator signals, for preventing transformer winding saturation by assuring that transformer current falls to zero before retriggering the timer and generating a subsequent voltage control signal.

DESCRIPTION OF THE DRAWINGS

These, and other features and advantages of the present invention will be better understood by reading the following detailed description taken together with the drawings, wherein.

DETAILED DESCRIPTION OF THE INVENTION

Figure 1:
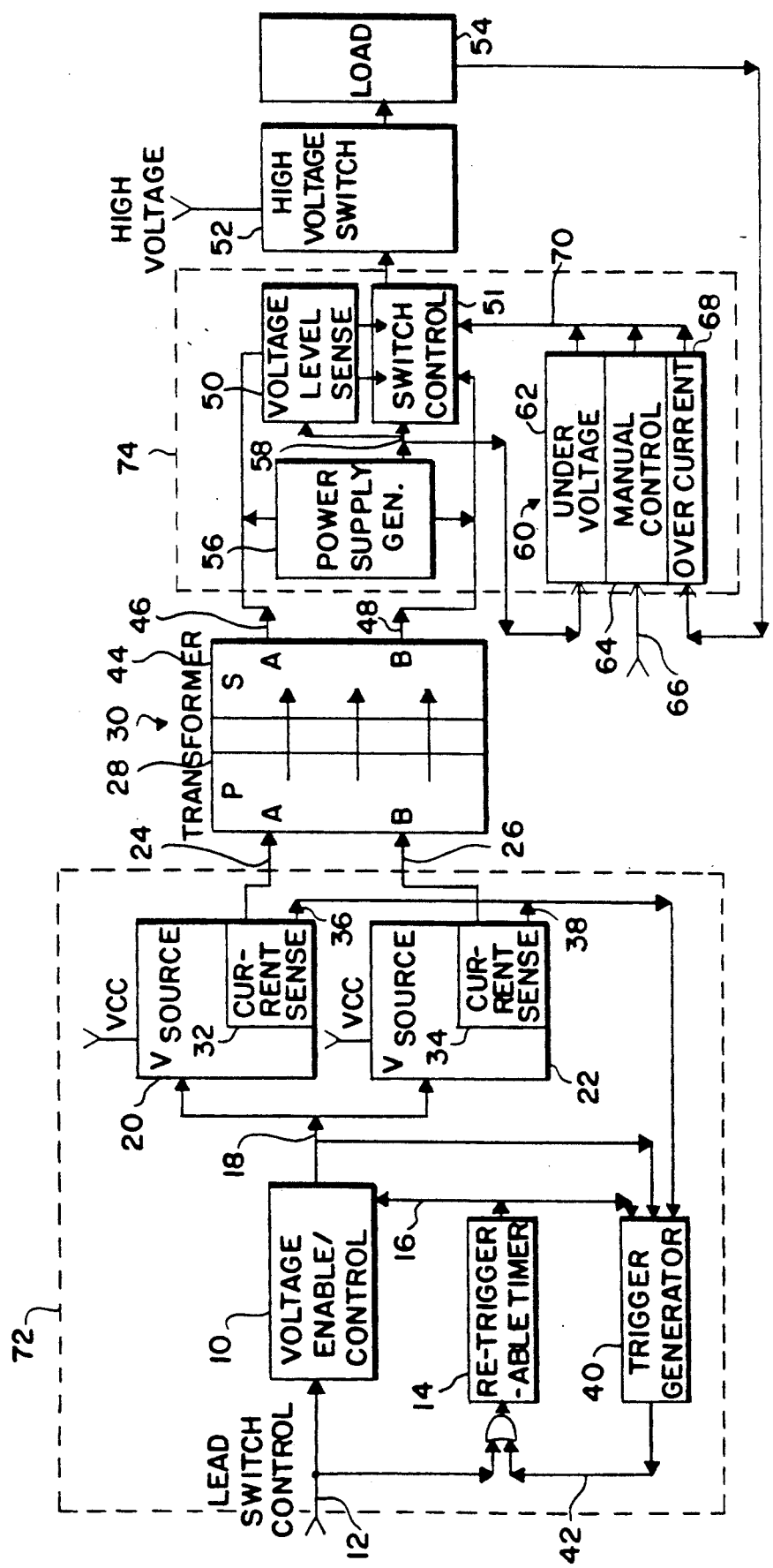
FIG. 1 is a block diagram of the transformer isolated drive circuit according to the present invention.

The transformer isolated drive circuit according to the present invention is shown in block diagram form in FIG. 1 wherein a voltage enable/control circuit 10 receives a low voltage load switch control signal on input lead 12. The load switch control signal is received from an external, low voltage circuit typically operating in the range of 0-5 volts. A retriggerable timer 14 provides a timed output signal on lead 16 having a preselected time period in response to at least one of the trigger signals on input leads 12 and 42. One of the trigger signals includes load switch control input signal on lead 12 which unconditionally retriggers retriggerable timer 14 regardless of the state of the timer's output signal on either the rising or falling edge of the signal.

In response to the load switch control signal and the timed output signal on lead 16, voltage enable and control circuit 10 provides a voltage control signal on lead 18 to first and second voltage sources 20 and 22 respectively. In response to the voltage control signal, the first and second voltage sources 20,22 provide first and second voltage signals 24,26 respectively, at one of a plurality of voltage levels which provides a voltage signal at alternating positive and negative voltage potentials with reference to the first and second inputs "A" and "B" of transformer 30. In one embodiment, the first and second voltage sources provide first and second voltage signals 24,26 at one of a high voltage level, a medium voltage level, and a low voltage level.

First and second voltage sources 20,22 also include first and second current sense means 32,34. The current sense means provide first and second zero current indicator signals over leads 36,38 upon the detection of zero current flow in the primary winding of the transformer.

Also included is trigger generator 40 which is responsive to the timed output signal on lead 16 from the retriggerable timer, the voltage control signal on lead 18, and the first and second zero current detection signals on leads 36,38, for providing a second retriggerable timer trigger signal on lead 42 upon the condition of zero current detected in the primary winding of the transformer as indicated by zero current indicator signals on leads 36,38 and upon the expiration of times output signal on lead 16 from retriggerable timer 14. Thus, the second retriggerable timer trigger signal on lead 42 is provided only after the preselected time period of timed output signal on lead 16 and then, only in conjunction with the detection of zero current flow in the primary winding of the transformer, assuring that any voltage applied to the primary winding of the transformer during the time period of the timed output signal on lead 16 has completely decayed or dropped to zero, and preventing transformer saturation.

Transformer 30 also includes a secondary winding or side 44 in which is induced a voltage which is of the same polarity as the voltage applied to primary winding 28. The magnitude or level of the voltage induced in the transformer's secondary winding is dependent upon the turns ratio of the transformer. First and second outputs "A" and "B", 46,48 from the secondary winding 44 couple the induced voltage from the secondary winding of the transformer to at least voltage level sense means 50 and switch control means 51. The voltage level sense means detects the magnitude and polarity of the voltage induced across the secondary winding outputs 46,48, and enables switch control circuit 51 which in turn enables high voltage load switch 52, for providing power to load 54 in response to a first, sensed voltage level, and disables load switch 52 in response to a second, sensed voltage level and polarity, thus disabling power to load 54.

The present invention also includes a power supply generator circuit 56, coupled to the first and second outputs 46,48 of the secondary winding 44 of the transformer, for providing a power signal on lead 58 to at least the voltage level sense circuitry 50 and the switch control circuit 51. Thus, the voltage induced in the secondary winding 44 of the transformer provides both switch control and power for at least a portion of the sense circuit 74.

Also included is drive circuit condition monitor circuit 60 comprising an under voltage monitor 62 coupled to power supply generator 56; a manual enable/disable monitor 64 coupled to an external enable/disable signal 66; and an over current monitor 68 coupled to load 54. The output 70 from condition monitoring circuit 60 is coupled to the switch control circuitry 51 and operates to appropriately enable and disable the high voltage load switch 52 in response to at least one of the plurality of monitored condition signals.

In one embodiment of the present invention, the transformer isolated drive circuit according to the present invention is implemented on first and second semiconductor devices 72,74 respectively. The input stage of the drive circuit of the present invention is implemented on the first semiconductor device 72 which includes voltage enable/control circuit 10, retriggerable timer 14, retriggerable timer trigger generator 40, and first and second voltage sources 20,22. The input stage circuitry located on first semiconductor device 72 is responsive to load a switch control signal on input lead 12 and coupled to primary winding 28 of transformer 30 by means of first and second voltage output signals 24,26.

Similarly, the output or sense portion of the drive circuit of the present invention may be implemented on a second semiconductor device 74 including power supply generator 56, voltage level sense control circuit 50, switch control circuit 51, and condition monitor 60.

Figure 2:
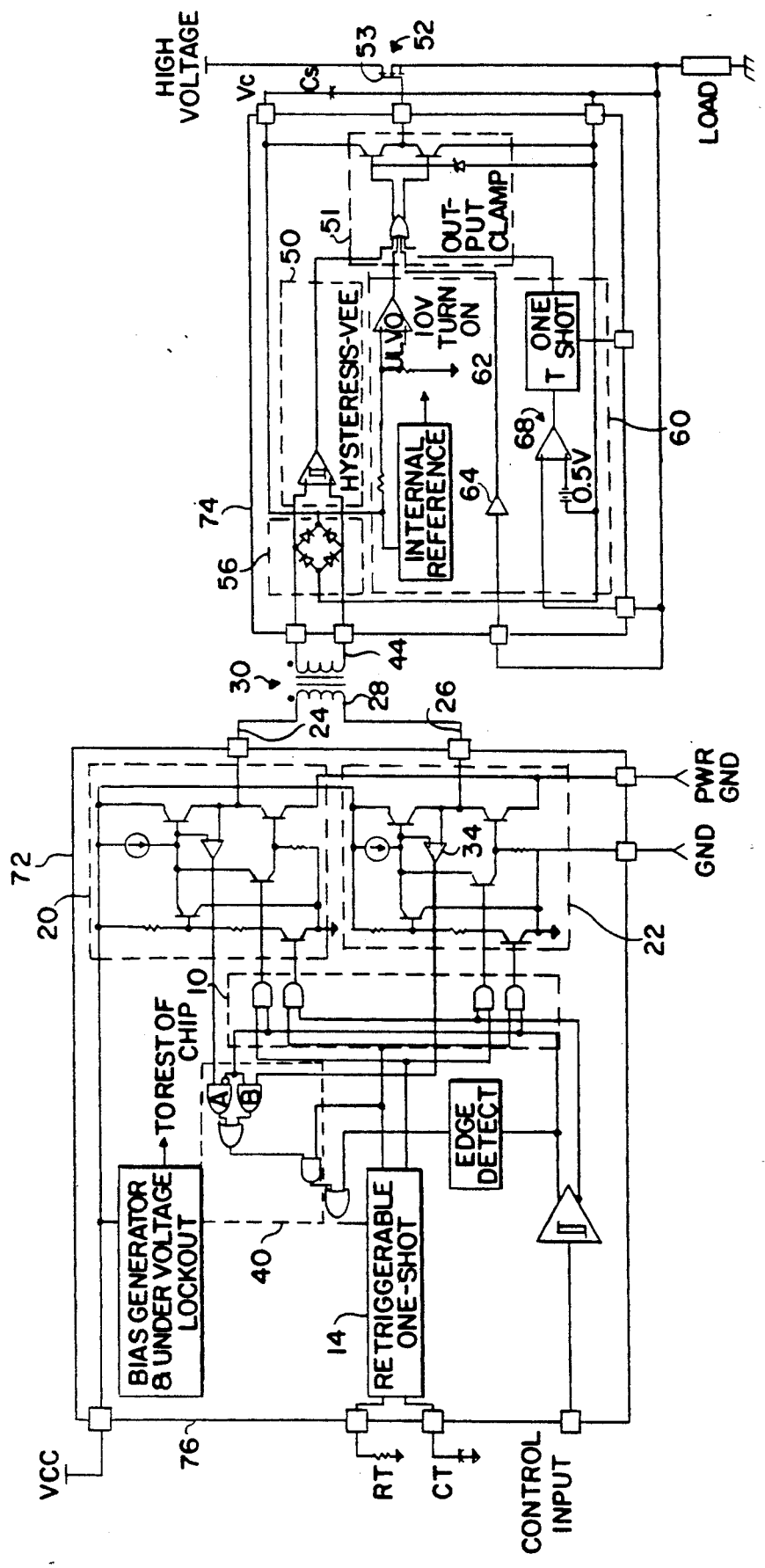
FIG. 2 is a block diagram of one embodiment of the transformer isolated drive circuit of the present invention implemented as first and second semiconductor devices coupled by a transformer.

A preferred embodiment of the transformer isolated drive circuit of the present invention is shown in the block diagram of FIG. 2 which corresponds, although with greater detail, to FIG. 1. The circuit is implemented on first and second semiconductor devices 72,74 wherein the first semiconductor circuit 72 implements the input or receiver stage of the circuit and which generates a voltage signal of appropriate voltage and polarity which is coupled through transformer 30 to second semiconductor device 74 which senses the received signal and appropriately enables and disables load switch 52.

The first semiconductor device 72 includes voltage enable/control circuit 10, retriggerable timer 14, trigger generator 40, and first and second voltage sources 20,22. Also included is bias voltage generator 76 which includes an under voltage lockout circuit which inhibits the output of the voltage sources 20,22 when the input supply voltage is below 9 volts. When adequate supply voltage is present, bias generator 76 supplies appropriate internal voltages and currents which allows voltage sources 20,22 to be enabled, thus assuring correct operation during circuit power-up and power-down. The overall time period which controls the operation of the first semiconductor device 72 is a function of both the pulse width generated by retriggerable timer 14 as well as the transformer core reset time. The pulse width of retriggerable timer 14 is set by timing resistor $R_T$ and timing capacitor $C_T$ at typically 600 nano seconds.

The second semiconductor device 74 as previously shown in FIG. 1 includes voltage level and sense circuit 50, load switch control circuit 51, power supply generator circuit 56 and condition monitor circuit 60 including an under voltage monitor 62, manual control monitor 64 and over current monitor circuit 68.

The operation of the transformer isolated drive circuit of the present invention and embodied in the circuit of FIG. 2 will now be explained in conjunction with the timing diagram of FIG. 3 wherein a time $t_1$, the magnetizing current 78 in primary winding 28 of transformer 30 decays to zero. Since the load switch control signal on lead 12 is low, trigger generator 40 receives the zero current indicator signal from current sense comparator 32 of voltage source 20 and thus retriggers retriggerable timer 14. A high or "full" voltage typically equal to $Vcc - 2Vsat - 2Vbe$ is applied to primary winding 28 of transformer 30 by controlling the first voltage source 20 to provide a "high" voltage on output 24 while controlling the second voltage source 22 to apply a low voltage on output 26.

When the retriggerable timer 14 is triggered by the detection of zero current flow in the primary winding of the transformer at time period $t_1$, timing capacitor $C_T$ is discharged. The "full" voltage of $V_{high}-V_{low}$, 80, is applied across the primary winding of the transformer causing a generally linear increase in the magnetizing current 78. At time $t_2$, the voltage across timing capacitor $C_T$ reaches a 2.5 volt threshold ending the timer's timed output signal. Output A, 24, is switched to V medium which is generally equal to $\frac{1}{2}$ ($V_{high}-V_{low}$) and voltage on output B, 26, is switched to $V_{high}$. The voltage applied to primary winding 28 of transformer 30 is thus reduced in half and its polarity inverted, 80, thus causing the magnetizing current 78 to fall at approximately one-half the rate at which it increased.

At time period $t_3$, current sense comparator 32 of voltage source 20 senses that the transformer's primary winding magnetizing current has reached zero and retriggers the retriggerable timer thus initiating another cycle. Operation of the circuit continues alternately recharging timing capacitor $C_T$, sensing zero magnetizing current, and retriggering the circuit as shown at time periods $t_4$, $t_5$ and $t_6$.

The rese in magnetizing current 78 in the primary winding of transformer 30 induces a current 82, in secondary winding 44 of the transformer which is of corresponding polarity as the magnetizing current induced in the primary winding and of a magnitude dependent upon the transformer's turn ratio. The current 82, induced in the secondary winding 44 of transformer 30 is sensed by voltage level sense comparator 50 which is a comparator with a hysteresis of 2Vcc. Thus, the "full" or high voltage applied to the primary winding 28 of transformer 30 is sensed by voltage level sense circuit 50 which disables switch control circuit 51 thus maintaining a low voltage 84 on the gate 53 of load switch 52.

Figure 3:
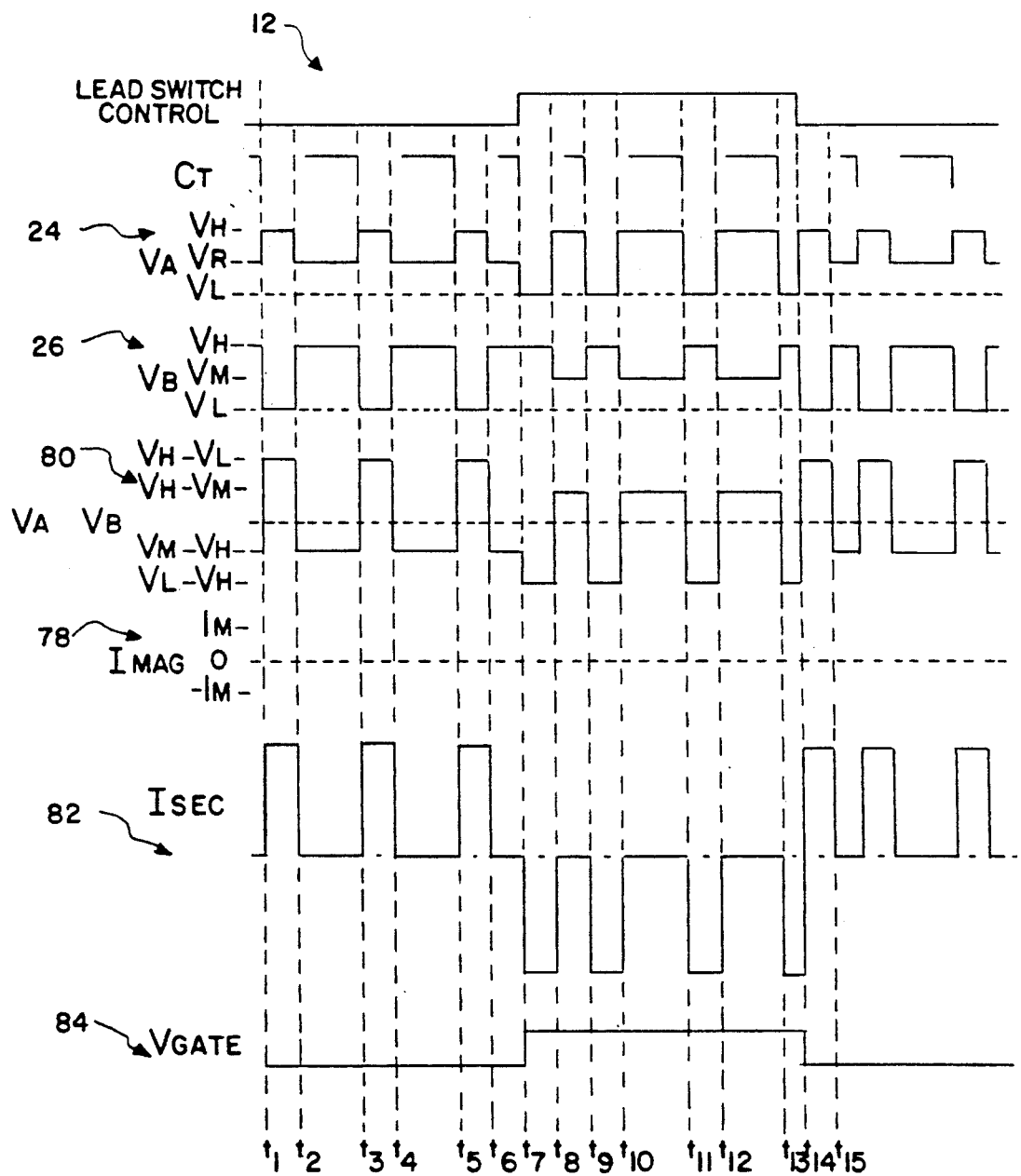
FIG. 3 is a timing diagram illustrating the voltage levels and timing signals of the transformer isolated drive circuit of the present invention.

At time period $t_7$, FIG. 3, the load switch control signal on input lead 12 transitions from low to high, indicting that the user of the circuit wishes to enable the load switch. Accordingly, the rising edge of the load switch control signal triggers the retriggerable timer 14 initiating a new cycle period and terminating the existing cycle. The "high" on load switch control signal input lead 12 is decoded by voltage enable/control circuit 10 and the polarity of the voltage on the two voltage sources 20,22 are reversed thus placing a "high" voltage on the B output 26 and a low voltage on A output 24. The difference in applied voltage generate a reversed polarity voltage and current 78 in the primary winding of transformer 30, thus inducing a voltage and current 82 of corresponding voltage level and polarity in the secondary winding 44 of transformer 30. The voltage induced across the transformer's secondary winding 44 is sensed by voltage level sense comparator 50. Since the voltage transitions to $-Vcc$, voltage level sense comparator 50 detects the change in voltage and provides a signal enabling load switch control circuit 51 which in turn applies the appropriate e.g. positive going signal 84, to the gate 53 of load switch FET 52.

If condition monitor circuit 60 does not detect any internal or external monitored condition which would disable the load switch, load switch control signal 84 remains in an active state through time period $t_{14}$ since the voltage induced by the secondary winding current 82 does not exceed the hysteresis (2 Vcc) of voltage level sense comparator 50.

At time period $t_8$, the voltage on timing capacitor $C_T$ reaches the 2.5 volt threshold which ends the time period of retriggerable timer 14, thus allowing the magnetizing current 78 to decay until at time period $t_9$, current sense comparator 34 of the second voltage source 22 detects a zero current in the primary winding 28 of transformer 30 causing trigger generator 40 to generate trigger signal 42 and thus initiating a new cycle period. The circuit operation during periods $t_7$ through $t_{13}$ are identical to the operation of the circuit described in relation to time periods $t_1$ through $t_6$ with the exception that the voltage on outputs A and B, 24–26, are reversed.

At time period $t_{14}$, the negative going edge of the load switch control signal on lead 12 interrupts and terminates the current ongoing circuit cycle initiated at time period $t_{13}$. Voltage enable/control circuit 10, under command from the load switch control signal, directs the first and second voltage sources 20,22 to reverse polarity thus applying a high voltage of a positive polarity on the A output of 24 with respect to the B output 26. This applied voltage causes a corresponding change in magnetizing current 78 and secondary current 82 thus inducing a 2 Vcc voltage change which is sensed by voltage sense comparator 50 thus providing a disable signal 84 on the gate 53 of load switch FET 52. Operation of the circuit then continues as described in relation to time periods $t_1$ through $t_6$.

Modifications and substitutions by one of ordinary skill in the art are considered to be within the scope of the present invention, which is not to be limited except by the claims which follow.

I claim:

1. A transformer isolated drive circuit, for selectively energizing a load switch over a duty cycle of 0-100% in response to a load switch control signal, comprising:

retriggerable timer means, for providing at least one timed output signal having a preselected time period in response to one of at least first and second trigger signals;

voltage enable and control means, responsive to a load switch input control signal, and said at least one timed output signal, for providing at least one voltage control signal;

said load switch input control signal operative as said first trigger signal;

first and second voltage sources, responsive to said at least one voltage control signal, for providing first and second voltage signals which are of selectable voltage potentials for providing a primary voltage of selectable voltage potential and wherein different combinations of the first and second voltage signals of selectable voltage potentials provide first and second voltage signals at an alternating positive and negative voltage polarity;

a transformer having a primary side and a secondary side, said primary side including first and second inputs coupled to said first and second voltage signals, and operative for inducing a secondary voltage across first and second outputs of said secondary side, said induced secondary voltage of the same relative voltage polarity as said primary voltage on said primary side, and of a voltage potential proportional to the turns ratio of the primary to the secondary side;

said first and second voltage sources including first and second current sense means respectively, for sensing current flow in said transformer primary side, and for providing first and second zero current indicator signals respectively, upon the detection of zero current flow in the primary side of said transformer;

trigger signal generator means, responsive to said first and second zero current indicator signals, said at least one voltage control signal and said at least one timed output signal, for providing said second trigger signal; and voltage level sense and switch control means, coupled to said first and second outputs of said transformer secondary side, and responsive to said relative voltage potential and polarity induced across said first and second transformer secondary side outputs, for enabling said load switch in response to a first sensed voltage potential and polarity, and for disabling said load switch in response to a second sensed voltage potential and polarity.

2. The circuit of claim 1 wherein said one of a plurality of voltage potentials includes one of a high voltage potential, a medium voltage potential and a low voltage potential.

3. The circuit of claim 2 wherein said medium voltage level is generally equal to one half the difference between the high voltage potential and the low voltage potential.

4. The circuit of claim 1 wherein sad load switch input control signal is operative for retriggering said retriggerable timer means at any time during said preselected timer period of said at least one timed output signal.

5. The circuit of claim 1 wherein said retirggerable timer trigger signal generator means generates said second retriggerable timer trigger signal only upon the expiration of the preselected timer period of said timed output signal.

6. The circuit of claim 5 wherein said retriggerable timer trigger signal generator means generates said second trigger signal upon the receipt of at least one of said first and second zero current indicator signals.

7. The circuit of claim 1 further including condition monitor means, for disabling sad load switch in response to at least one of a plurality of monitored conditions.

8. The circuit of claim 7 wherein said monitored conditions include at least one of an under voltage condition, an over current condition and a manual disable condition.

9. The circuit of claim 1 further including power supply generator means, coupled to said first and second outputs of said transformer secondary side, for providing power to at least said voltage level sense means.

10. The circuit of claim 9 wherein said power supply generator means includes at least a full-wave bridge rectifier.

11. The circuit of claim 1 wherein said transformer isolated drive circuit is implemented on first and second semiconductor devices.

12. The circuit of claim 11 wherein said first semiconductor device is responsive to said load switch input control signal and coupled to said first and second inputs of said transformer primary side, and includes said retriggerable timer means, said voltage enable and control means and said first and second voltage sources, and wherein said second semiconductor device includes at least said voltage level sense means and load switch control means.

13. The circuit of claim 11 wherein said second semiconductor device further includes power supply generator means and condition monitor means.

* * * * *

UNITED STATES PATENT AND TRADEMARK OFFICE
CERTIFICATE OF CORRECTION

PATENT NO. : 5,206,540
DATED : April 27, 1993
INVENTOR(S) : Claudio de Sa e Silva, et al.

It is certified that error appears in the above-indentified patent and that said Letters Patent is hereby corrected as shown below:

Column 5, line 24, "rese" should read --rise--.

Column 5, line 39, "indicting" should read --indicating--.

Column 8, line 6, "sad load switch" should read ---said load switch--.

Signed and Sealed this

Third Day of May, 1994

Attest:

BRUCE LEHMAN

Attesting Officer

Commissioner of Patents and Trademarks